(12) United States Patent
Atalar et al.

(10) Patent No.: US 10,571,537 B2
(45) Date of Patent: Feb. 25, 2020

(54) MULTI-PURPOSE GRADIENT ARRAY FOR MAGNETIC RESONANCE IMAGING

(71) Applicant: Bilkent University, Ankara (TR)

(72) Inventors: Ergin Atalar, Ankara (TR); Niyazi Koray Ertan, Ankara (TR); Soheil Taraghinia, Ankara (TR)

(73) Assignee: Bilkent University, Ankara (TR)

( * ) Notice: Subject to any disclaimer, the term of this patent is extended or adjusted under 35 U.S.C. 154(b) by 147 days.

(21) Appl. No.: 15/694,029

(22) Filed: Sep. 1, 2017

(65) Prior Publication Data

US 2018/0011156 A1 Jan. 11, 2018

Related U.S. Application Data

(63) Continuation-in-part of application No. PCT/KR2016/005160, filed on May 16, 2016.

(60) Provisional application No. 62/382,349, filed on Sep. 1, 2016, provisional application No. 62/482,464, filed on Apr. 6, 2017, provisional application No. 62/164,896, filed on May 21, 2015.

(51) Int. Cl.
  *G01R 33/385* (2006.01)
  *G01R 33/483* (2006.01)
(52) U.S. Cl.
  CPC ....... *G01R 33/3852* (2013.01); *G01R 33/385* (2013.01); *G01R 33/4835* (2013.01)
(58) Field of Classification Search
  CPC .............. G01R 33/385; G01R 33/3852; G01R 33/4835
  See application file for complete search history.

(56) References Cited

U.S. PATENT DOCUMENTS 5,278,504 A 1/1994 Patrick et al.
5,382,904 A * 1/1995 Pissanetzky ....... G01R 33/3806
                                                        29/602.1
(Continued)

FOREIGN PATENT DOCUMENTS

JP 2007-167143 A 7/2007
JP 2008-168132 A 7/2008
(Continued)

OTHER PUBLICATIONS

International Search Report dated Aug. 19, 2016 from PCT/KR2016/005160, pp. 3.

(Continued)

*Primary Examiner* — Dixomara Vargas
(74) *Attorney, Agent, or Firm* — Nelson Mullins Riley & Scarborough LLP; Thomas J. Engellenner; Reza Mollaaghababa

(57) ABSTRACT

A system for multi-slice magnetic resonance imaging (MRI) comprises a gradient coil array comprising a plurality of independent coils distributed about an enclosure; and a controller configured to concurrently actuate said plurality of coils so as to generate a spatially-varying magnetic field within said enclosure such that for at least first and second volumetric slices, a magnetic field magnitude associated with at least one location in the first volumetric slice is substantially equal to a magnetic field magnitude associated with a respective location in the second volumetric slice.

34 Claims, 8 Drawing Sheets

(56) References Cited

U.S. PATENT DOCUMENTS

| | | | | |
|---|---|---|---|---|
| 5,659,281 A * | 8/1997 | Pissanetzky | ....... | G01R 33/3806 |
| | | | | 324/318 |
| 6,016,439 A * | 1/2000 | Acker | ...................... | A61B 5/06 |
| | | | | 600/411 |
| 6,448,773 B1 * | 9/2002 | Zhang | ............. | G01R 33/56518 |
| | | | | 324/307 |
| 6,472,872 B1 * | 10/2002 | Jack, Jr. | ............. | G01R 33/3875 |
| | | | | 324/307 |
| 6,501,977 B1 | 12/2002 | Kimmlingen | | |
| 6,563,315 B1 | 5/2003 | Boskamp | | |
| 6,900,638 B1 | 5/2005 | Yair et al. | | |
| 7,202,734 B1 | 4/2007 | Raab | | |
| 7,800,368 B2 * | 9/2010 | Vaughan | ............ | G01R 33/5612 |
| | | | | 324/318 |
| 8,125,225 B2 * | 2/2012 | Koretsky | ................ | A61K 31/29 |
| | | | | 324/309 |
| 9,755,576 B2 | 9/2017 | Perrault | | |
| 9,923,518 B2 | 3/2018 | Perrault | | |
| 10,120,050 B2 * | 11/2018 | Feiweier | ................ | G01R 33/56 |
| 2001/0024122 A1 | 9/2001 | Mulder et al. | | |
| 2007/0216409 A1 | 9/2007 | Overweg | | |
| 2007/0279058 A1 | 12/2007 | Bulkes et al. | | |
| 2008/0272784 A1 | 11/2008 | Harvey et al. | | |
| 2011/0254551 A1 | 10/2011 | Leussler | | |
| 2014/0320132 A1 | 10/2014 | Schmale | | |
| 2016/0181986 A1 | 6/2016 | Perrault | | |
| 2016/0181987 A1 | 6/2016 | Perrault | | |
| 2018/0081003 A1 | 3/2018 | Atalar | | |
| 2018/0120393 A1 | 5/2018 | Atalar | | |
| 2018/0292502 A1 | 10/2018 | Atalar | | |

FOREIGN PATENT DOCUMENTS

| | | |
|---|---|---|
| JP | 2008264101 A | 11/2008 |
| JP | 2013000591 A | 1/2013 |
| JP | 2014-083445 A | 5/2014 |
| KR | 100900862 B1 | 6/2009 |
| KR | 101503494 B1 | 3/2015 |

OTHER PUBLICATIONS

International Written Opinion dated Aug. 19, 2016 from PCT/KR2016/005160, pp. 6.

Gudino et al., "1.5T On-Coil Current-Mode Class-D (CMCD) Amplifier with Amplitude Modulation Feedback and Voltage-Mode Class-D (VMCD) Preamplifier," Proc. Intl. Soc. Mag. Reson. Med. 18 (2010).

International Search Report dated Aug. 22, 2016 from PCT/KR2016/005150. pp. 4.

International Written Opinion dated Aug. 22, 2016 from PCT/KR2016/005150, pp. 7.

* cited by examiner

MULTI-PURPOSE GRADIENT ARRAY FOR MAGNETIC RESONANCE IMAGING

RELATED APPLICATIONS

This patent application claims the benefit of U.S. Provisional Application No. 62/382,349, filed on Sep. 1, 2016, entitled "A Multi-purpose Gradient Array for Magnetic Resonance Imaging," and the benefit of U.S. Provisional Application No. 62/482,464, filed on Apr. 6, 2017, entitled "A Gradient Array for Magnetic Resonance Imaging and Associated Method," the contents and teachings of each of which are hereby incorporated by reference in their entirety. The present application also claims priority to PCT Application No. PCT/KR2016/005160, filed on May 16, 2016, entitled "Gradient Magnetic Field Generation Module Using Plurality of Coils so as to Generate Gradient Magnetic Field" as a continuation-in-part application. This PCT application is also herein incorporated by reference in its entirety.

BACKGROUND

In conventional magnetic resonance imaging (MRI) systems, three types of magnetic fields are conventionally utilized to obtain an image of an object. A first or primary magnetic field, termed the $B_0$ field is static in time and substantially homogenous inside an imaging volume. The $B_0$ field typically determines a resonance frequency of the atoms of the object being imaged, depending on the gyromagnetic ratio of the atoms.

Further, to obtain an image of the object, the Mill system typically generates a spatially modulated resonance frequency of the object, which is provided by the second type of magnetic fields termed gradient fields. The aim of the modulation can be in various forms such as slice selection, phase encoding and frequency encoding. However, the gradient fields are typically configured to discriminate different spatial locations by applying additional magnetic fields, which can have certain spatial dependencies. In conventional MRI scanners, there are three gradient coils called x-gradient, y-gradient and z-gradient that are used to encode three spatial dimensions. During an imaging sequence, spatial encoding of the object can change as a function of time for imaging purposes. Accordingly, an MRI system typically drives gradient coils dynamically as a function of time and wideband current waveforms are necessary.

Conventionally, an MRI system drives each of the three gradient coils with a relatively high power amplifier. Typically, each of the three gradient coils can generate a linearly changing magnetic field in its corresponding dimension (x-, y, or z-axes), which are termed linear gradients.

The third type of magnetic field generated by the MRI system is termed a radio frequency (RF) field. The MRI system utilizes the RF field to excite spins within the object being imaged.

SUMMARY

Conventional MRI systems suffer from a variety of deficiencies. For example, as provided above, typical MRI systems drive each of three gradient coils with a high power amplifier. Accordingly, each of the three gradient coils is responsible for generating a linearly changing magnetic field in the corresponding dimension. However, conventional MRI systems are configured to generate images of an object in a slice-by-slice manner. This process can be relatively time consuming for the end user. Further, conventional gradient coils are configured to draw a relatively large amount of power. This requires conventional MRI systems to utilize relatively high power amplifiers which can be relatively costly and can generate large amounts of heat during use.

By contrast to conventional MRI systems, embodiments of the present invention relate to a multi-purpose gradient array for magnetic resonance imaging. In one arrangement, a multi-slice magnetic resonance imaging system includes an array of gradient coils and a controller configured to generate several different field combinations in the array by applying different weightings to the magnitude of a current applied to each gradient coil. With such a configuration, in some embodiments, the multi-slice magnetic resonance imaging system can provide multi-slice excitation of an object being imaged with a single band RF pulse. As such, the system can excite multiple volumetric slices at the same time for a given frequency, which can reduce the amount of time required by conventional imaging systems to image an object. Further, the system provides for single slice selection and allows for imaging of a flexible volume of interest. Also as such, the system can customize the magnetic field distribution for each patient, each disease, and each contrast mechanism separately. Additionally, with such a configuration, the system allows for a decrease in the stimulation of peripheral nerves found in conventional imaging and can optimize the amount power used relative to conventional imaging systems.

In one arrangement, embodiments of the invention relate to a system for multi-slice magnetic resonance imaging (MRI), which comprises a gradient coil array comprising a plurality of independent coils distributed about an enclosure; and a controller configured to concurrently actuate said plurality of coils so as to generate a spatially-varying magnetic field within said enclosure such that for at least first and second volumetric slices, a magnetic field magnitude associated with at least one location in the first volumetric slice is substantially equal to a magnetic field magnitude associated with a respective location in the second volumetric slice.

In some embodiments, the controller is configured to select a plurality of excitation signals applied to said plurality of coils such that magnitudes of first derivatives of the magnetic field along at least one dimension at said locations of the first and the second volumetric slices are substantially equal. In some such embodiments, the controller is configured to select the plurality of excitation signals applied to said plurality of coils such that the second derivatives of the magnetic fields along said one dimension at said locations of the first and the second volumetric slices are substantially zero.

The system can further include one or more excitation sources that operate under control of the controller and are in electrical communication with the coils for inducing electrical currents therein. By way of example, an excitation source can be a voltage source, a current source, or a combination thereof. In some embodiments, the system can include a plurality of excitation sources each of which is in electrical communication with one of said coils. In some such embodiments, the system can further include a plurality of amplifiers each of which is in electrical communication with one of said excitation sources and one of said coils for amplifying excitation signals applied to said coils. The controller can transmit at least one control signal to the excitation source(s) so as to induce different electrical currents in said coils for generating said spatially-varying magnetic field.

In some embodiments, controller is configured to select a plurality of excitation signals applied to said coils such that a magnetic field gradient associated with each coil has a gradient strength greater than about 80 mT/m/Amp.

In some embodiments, the spatially-varying magnetic field satisfies the following relations at said locations of said first and second slices:

$$B(z_1)=B(z_2),$$

$$|B'(z_i)|=G_z, \text{ where } i=1, 2,$$

$$B''(z_i)=0, \text{ where } i=1, 2.$$

where, $B(z_1)$ and $B(z_2)$ denote magnitude of the magnetic fields as said locations in the first and second volumetric slices, respectively, $|B'(z_i)|$ denotes the absolute value of the derivative of the magnetic field at any of said locations in the first and second volumetric slices along a dimension z, and $B''(z_i)$ denotes the second derivative of the magnetic field at any of said locations in the first and second volumetric slices along the dimension z.

The above constraints can be utilized to determine the currents that need to be applied to the gradient coils.

In some embodiments, the at least one location in each of the first and second volumetric slices comprises two locations. For example, in each volumetric slice, a first location can be located on a longitudinal axis of the enclosure and a second location can be offset from the first location, e.g., along an axis orthogonal to the longitudinal axis. In some such embodiments, the magnetic fields at the locations within each of the at least first and second volumetric slices and across those slices exhibit substantially equal magnetic field and also substantially equal absolute values of the first derivative of the magnetic field at least along one dimension. For example, in such embodiments, the magnetic field at volumetric slices of interest, e.g., said first and second volumetric slices, can satisfy the following relations:

$$B_{\rho=\rho_1}(z_1)=B_{\rho=\rho_2}(z_1)=B_{\rho=\rho_1}(z_2)=B_{\rho=\rho_2}(z_2), \text{ and}$$

$$|B_{\rho=\rho_1}'(z_1)|=|B_{\rho=\rho_2}'(z_1)|=|B_{\rho=\rho_1}'(z_2)|=|B_{\rho=\rho_2}'(z_2)|,$$

where

B denotes the magnitude of the magnetic field, $z_1$ and $z_2$ denote the first and second volumetric slices, $\rho_1$ and $\rho_2$ denote the first and second locations in each of the volumetric slices, and B' denotes the gradient of the magnetic field along a dimension, e.g., the longitudinal axis (i.e., z-axis).

The spatially-varying magnetic field can have a variety of different forms. By way of example, the spatially-varying magnetic field can exhibit a spatially periodic variation. In other embodiments, the magnetic field may not be spatially periodic.

In some embodiments, the volumetric slices can have a width along at least one dimension in a range of about 0.5 mm to about 10 mm. In some embodiments, the volumetric slices can have a width in a range of about 2 mm to about 20 cm.

The system can further include at least one radiofrequency (RF) coil configured to apply at least one RF pulse to said volumetric slices. In some embodiments, a shield is disposed around said enclosure so as to decouple an RF field generated by said at least one RF coil from the magnetic field generated by said coil array.

In some embodiments, the RF pulse(s) can be single-band RF pulse(s), e.g., the RF pulse(s) can have a bandwidth in a range of about 100 Hz to about 100 kHz. In other embodiments, the RF pulse(s) can be multi-band RF pulse(s), e.g., the pulses can have a bandwidth in a range of about 100 Hz to about 500 kHz.

In some embodiments, the RF pulse(s) can have a duration in a range of about 400 microseconds to about 10 milliseconds.

In some embodiments, the gradient coils are inductively coupled to one another. In some such embodiments, the controller is configured to apply at least one signal to said amplifiers so that voltages applied to the coils for generating desired currents in the said coils are according to the following relation:

$$V_{N\times 1}(t) = R_{N\times N} \cdot I_{N\times 1}(t) + M_{N\times N} \cdot \frac{d}{dt}I_{N\times 1}(t)$$

wherein V denotes voltages applied to the coils, R denotes the resistances of the coils, M is matrix indicative of mutual inductive couplings of the coils, and I denotes the currents induced in the gradient coils.

In one arrangement, embodiments of the invention relate to a magnetic resonance imaging system. The system includes a magnetic field generator having a gradient coil array, each coil of the array being configured to generate a magnetic field independent of a magnetic field generated by any of the other coils of the array. The system includes a set of amplifiers, each of which being in electrical communication with one of said coils of the array for applying an excitation signal to said coil. The system includes a controller in electrical communication with said amplifiers and configured to apply a plurality of signals to said amplifiers such that the amplifiers apply a plurality of excitation signals to said coils for generating a magnetic field such that at least first and second volumetric slices associated with at least two of said coils exhibit a magnetic field distribution characterized by substantially similar magnetic field gradients.

In one arrangement, embodiments of the invention relate to a method for generating a magnetic resonance image. The method includes applying a static magnetic field to an enclosure configured to receive a sample. The method includes utilizing a plurality of independent coils (coils to which different currents can be applied) to generate a gradient magnetic field in said enclosure, said gradient magnetic field characterized by spatial variations such that for at least first and second volumetric slices, a magnetic field magnitude associated with at least one location in the first volumetric slice is substantially equal to a magnetic field magnitude associated with a respective location in the second volumetric slice. The method includes applying an RF excitation signal to said first and second volumetric slices to excite selected spin type of said sample.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Embodiments of the present innovation relate to a multi-purpose gradient array for magnetic resonance imaging. In one arrangement, a multi-slice magnetic resonance imaging system includes an array of gradient coils and a controller configured to generate several different field combinations in the array by applying different weightings to the currents applied to the gradient coils. With such a configuration, in some embodiments, the multi-slice magnetic resonance imaging system can provide multi-slice excitation of an object being imaged with a single band RF pulse. As such, the system can excite multiple slices at the same time for a given frequency which can reduce the amount of time taken by conventional imaging systems to image an object. Further, the system provides for single slice selection and allows for imaging of a flexible volume of interest. Also as such, the system can customize the magnetic field distribution for each patient, each disease, and each contrast mechanism separately. Additionally, with such a configuration, the system allows for a decrease in the stimulation of peripheral nerves found in conventional imaging and can optimize the amount power used relative to conventional imaging systems.

Various terms are used herein according to their ordinary meanings in the art. The term "about," as used herein, denotes a variation of at most 5% around a numerical value. The term "substantially equal," as used herein, denotes a deviation, if any, of at most 10% relative to a perfect state of equality. The term "volumetric slice" refers to a three-dimensional volume element, e.g., within an enclosure of an MRI system.

Figure 1:
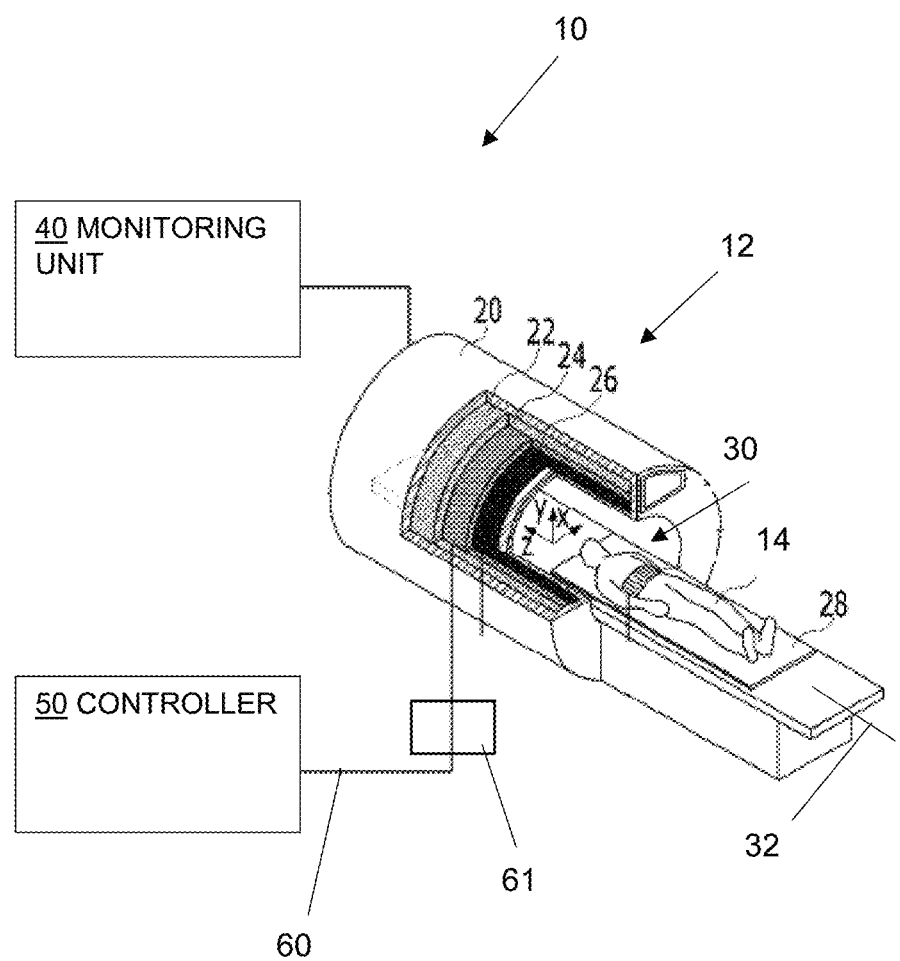
FIG. 1 illustrates a schematic representation of a multi-slice magnetic resonance imaging system, according to one arrangement.

FIG. 1 illustrates an example schematic representation of an embodiment of a multi-slice magnetic resonance imaging (MRI) system 10. In one arrangement, the system 10 includes a magnetic field generator 12, a monitoring unit 40 configured to monitor and/or control positioning of an object 14 disposed within a gantry 20, and a controller 50.

The magnetic field generator 12 is configured to generate an MRI image of an object 14, such as a patient. In the example illustrated, the magnetic field generator 12 includes the gantry 20 surrounding a main magnet 22, a gradient coil array 24, and an RF coil 26. The gantry 20 can minimize or prevent radiation of electromagnetic waves generated by the main magnet 22, gradient coil array 24, and the RF coil 26 from interfering with local electrical equipment, such as the monitoring unit 40 or controller 50.

The gantry 20 can further define a bore 30 extending along a longitudinal axis 32. In use the object 104 can be placed on a table 28 that can be inserted into the bore 30 along the longitudinal axis 32. Further, the bore 30 is configured to receive electromagnetic fields generated by the main magnet 22, gradient coil array 24, and the RF coil 26. For example, as indicated in FIG. 1, the main magnet 22, the gradient coil array 24, and the RF coil 26 can extend along a longitudinal axis 32 of the bore 30 and the gantry 20. The main magnet 22 and gradient coil array 24 can generate an electromagnetic field and an oblique magnetic field, respectively, within the bore 30 while the RF coil 26 can provide an RF excitation signal within the bore toward the object 14.

The main magnet 22 is configured to generate a primary or $B_0$ magnetic field, which is a static magnetic field, to align the magnetic dipole moments of the nuclei included in the object 14 in a predetermined direction. The $B_0$ magnetic field determines a resonance frequency of the nuclei of the object 14 being imaged, depending on the gyromagnetic ratio of the nuclei. As the $B_0$ magnetic field generated by the main magnet 22 is relatively strong and uniform, a relatively precise and accurate MR image with respect to the object 10 can be generated by the system 10.

The gradient coil array 24 is configured as a plurality of independent coils distributed about the bore 30, and can be configured as x-gradient coils, y-gradient coils, and/or z-gradient coils for each axis of the multi-slice MRI system 10. For example, with additional reference to FIG. 2, the gradient coil array 24 is configured as a z-gradient coil array having independent coils 52 disposed about an enclosure 54a provided by a shell 54. The term "independent coils," as used herein, is intended to mean that a current can be applied to each coil independent of the other coils. For example, in some embodiments, different currents can be applied to different coils of the gradient array. While each of the coils 52 can be formed in a number of ways, in one arrangement, each coil 52 is formed by winding a wire about the enclosure 54a. Further, the gradient coil array 24 can include any number of coils 52 distributed along a longitudinal axis 56 of the enclosure 54. For example, as illustrated the gradient coil array 24 includes gradient coils 52-1 through 52-N, where N can be for example, in a range of about 2 to 24 for a single layer and in a range of about 2 to 96 for either three or six different layers.

Returning to FIG. 1, the RF coil 26 is configured to excite spins within the object 14 being imaged. While the RF coil 26 can be configured in a variety of ways, in one arrangement and with reference to FIG. 2, the RF coil 26 is configured as a birdcage RF coil. Further, in the arrangement illustrated, a shield 55 is disposed within the enclosure 54a to decouple an RF field generated by the RF coil 26 from a magnetic field generated by the gradient coil array 24.

Returning to FIG. 1, the controller 50, such as a computerized device having a memory and a processor, is disposed in electrical communication with the gradient coil array 24 of the magnetic resonance imaging apparatus 12 via a set of cables 60. In one arrangement, each cable of the set of cables 60 electrically connects the controller 50 to a respective gradient coil 52 of the gradient coil array 24. To minimize the introduction of noise into the set of cables 60, a filter apparatus 61 can be disposed in electrical communication with each cable of the set of cables 60. For example, the filter apparatus 61 can include a capacitor, such as a 10 nF capacitor, disposed between each cable and a shield, such as a Faraday cage (not shown), at least partially surrounding the gradient coil array 24.

Figure 2:
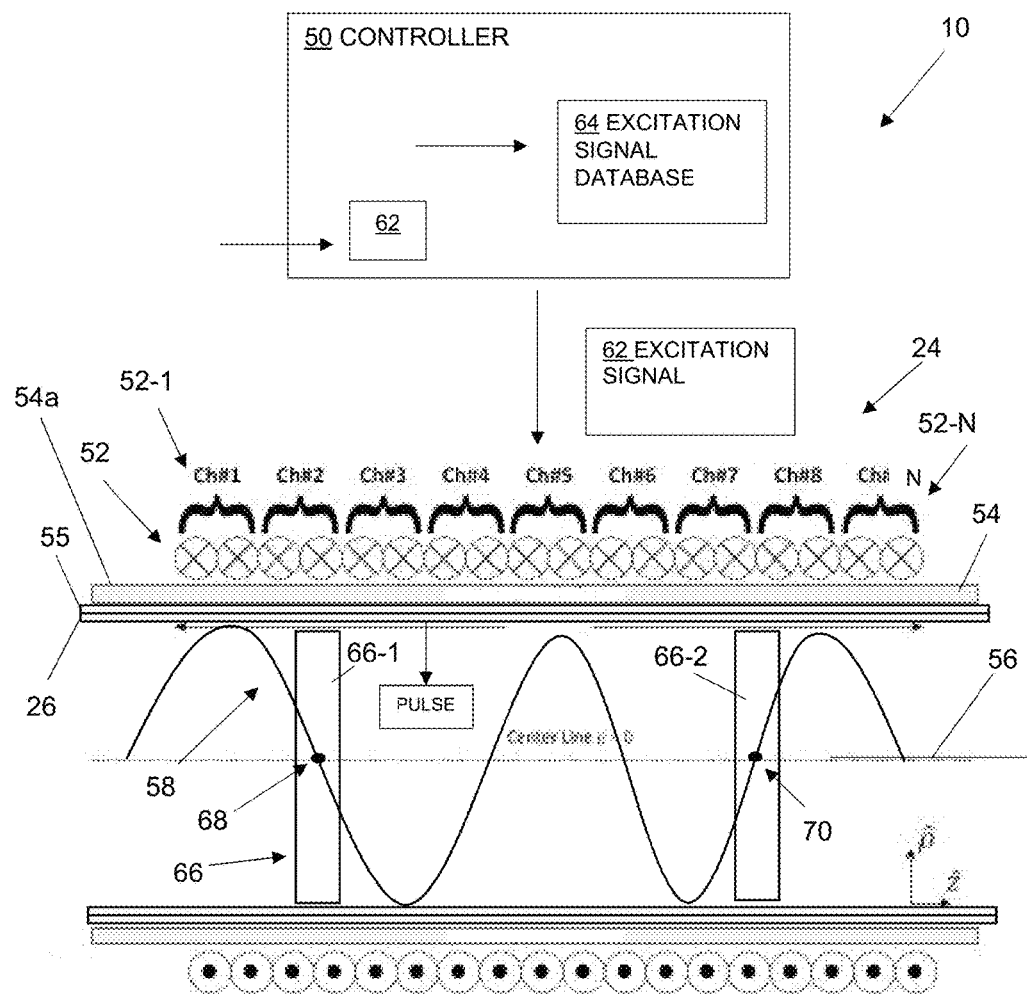
FIG. 2 illustrates a schematic representation of a controller and gradient coil array of FIG. 1, according to one arrangement.

With additional reference to FIG. 2, the controller 50 is configured to concurrently actuate the coils 52 of the gradient coil array 24 to generate one or more spatially-varying magnetic fields 58 within the enclosure 54a. For example, the spatially-varying magnetic field 58 can exhibit a spatially periodic variation, such as a spatial variation substantially resembling a sine wave, as shown, a triangle wave, or square pulse wave. In such a case, the period of the magnetic field wave 58 varies along the longitudinal axis 56 of the enclosure 54a. In some embodiments, the spatially-varying magnetic field is not periodic. For example, such a spatially varying magnetic field may exhibit a rising value from a distal end of the enclosure 54a to reach a maximum value at a spatial location within the enclosure 54a followed by a decreasing value towards the proximal end of the enclosure 54a.

In one arrangement, the controller 50 is configured to utilize an excitation signal 62 to drive the gradient coil array 24 which, in turn, results in the modulation of the current within each gradient coil 52 of the gradient coil array 24 to generate the magnetic fields 58. The excitation signal 62 can be configured to cause each gradient coil 52 to generate a magnetic field 58 having a magnetic field gradient with a variety of strengths. For example, the controller 50 can provide a particular excitation signal 62 such that, when applied to the gradient coil array 24, a magnetic field gradient associated with each coil has a gradient strength greater than about 80 mT/m/Amp.

The controller 50 can be configured to retrieve parameters defining the excitation signal 62 from a variety of sources. For example, the controller 50 can be configured to select the parameters defining the excitation signal 62 from an excitation database 64, such as stored by a memory associated with the controller. In another example, the controller 50 can be configured to receive the excitation signal 62 as input from a system operator via an input mechanism, such as a graphical user interface. In either case, the excitation signal 62 is configured to excite the gradient coil array 24 to generate the magnetic field wave 58 such that the magnetic field 58 has a spatial variation across multiple volumetric slices 66 such that the magnitude of the magnetic field at respective locations of two or more volumetric slices are substantially equal. By way of illustration, in this example, the magnetic field 58 has a spatial variation such that for volumetric slices 66-1 and 66-2, a magnitude of the magnetic field 58 at a first location 68 in the volumetric slice 66-1 is substantially equal to a magnitude of the magnetic field at a corresponding second location 70 in the volumetric slice 66-2. The term "substantially equal," as used herein, denotes a variation of at most 10% relative to a complete equality of the magnetic field magnitudes. The controller can be implemented in hardware, firmware, and/or software in a manner known in the art. For example, the controller 50 can include a processor, memory modules (e.g., random access memory (RAM) and permanent memory) and one or more communication buses which allow communication among different components of the controller, among other elements.

The volumetric slices can have different widths and thicknesses. For example, with continued reference to FIG. 2, each volumetric slice 66 can be characterized by a width 72 along the longitudinal axis 56, e.g., in a range of between about 0.5 mm and about 10 mm. In another example, with reference to FIG. 6, each volumetric slice 66 can be characterized by a width 172 along the longitudinal axis 56 in a range of, e.g., between about 2 mm to about 20 cm. Such volumetric slices can be termed slabs.

Figure 6:
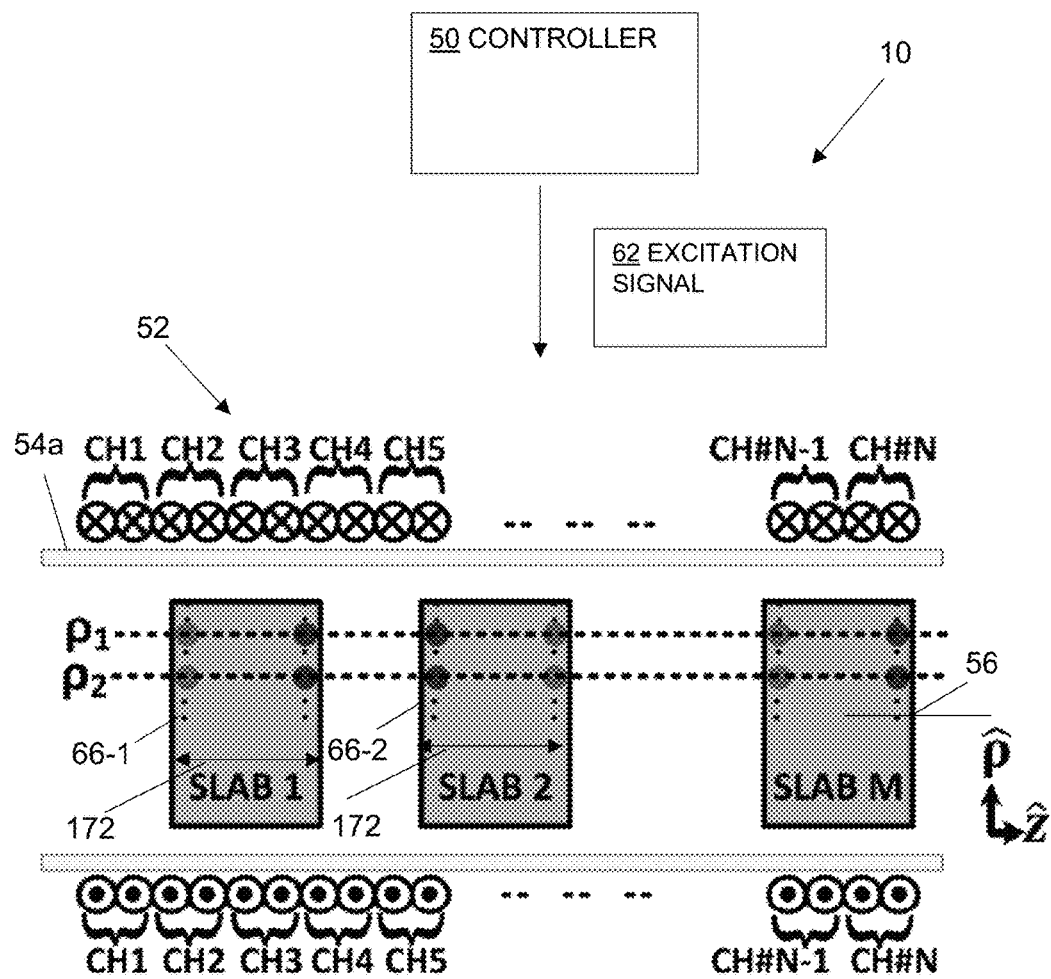
FIG. 6 illustrates an arrangement in which a spatially-varying magnetic field is established within an enclosure such that for a plurality of volumetric slabs, the magnetic field magnitudes at a plurality of locations within one slab are substantially equal to the magnetic field magnitudes at respective plurality of locations at two other volumetric slabs.

As shown in FIG. 6, the magnetic field distribution in each slab 66-1, 66-2 and 66-3 is such that there are multiple points in each slab that at which the magnetic field magnitude is substantially equal to respective points in the two slabs. Within each slab, the variation of the magnetic field can be sufficiently large such that the spins located at different locations of the slab would exhibit different resonance frequencies. In such an embodiment, the application of a multi-band RF excitation signal to the slabs 66-1, 66-2 and 66-3 having frequencies suitable for exciting the spins with different resonance frequencies in each slab can concurrently excite those spins in the three slabs, thus significantly improving the data acquisition time.

Returning to FIG. 2, in order to generate a magnetic field 58 having substantially-equal magnitudes at corresponding locations 68, 70 across separate volumetric slices 66-1, 66-2, the controller 50 is configured to provide an excitation signal 62 to the gradient coil array 24 to generate spatially-varying magnetic fields 58 that are different from conventional linear gradient profiles. A variety of approaches can be taken to generate these spatially-varying magnetic field 58 with such characteristics.

Figure 3:
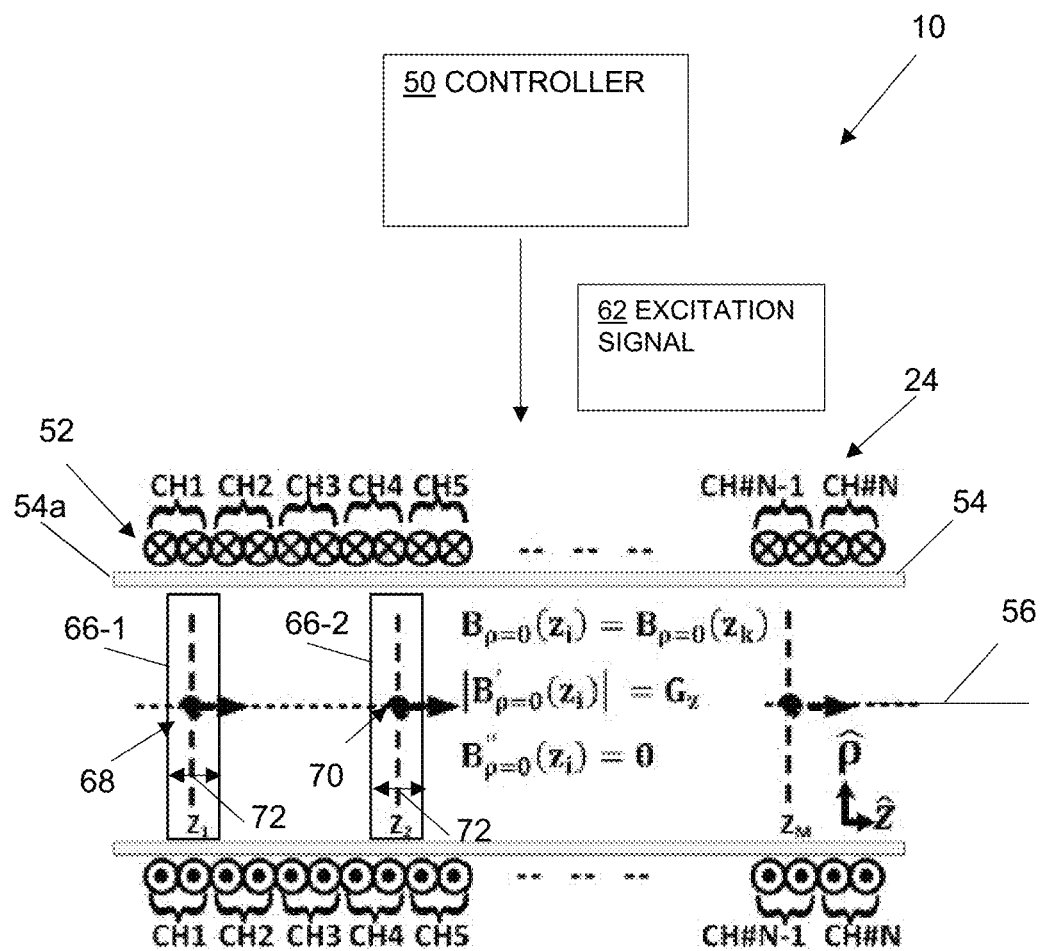
FIG. 3 illustrates a schematic representation of the controller of FIG. 2 applying an excitation signal to the gradient coil array, according to one arrangement.

One such approach is termed the one point per slice technique (1PPS). For example, with reference to FIG. 3, M different slice locations, e.g., 66-1, 66-2, and N gradient channels 52 are shown. In the 1PPS method, a single design point, e.g., location 68, 70, is located at the center of each given volumetric slice location 66-1, 66-2 such that each location 68, 70 is positioned along a longitudinal axis 56 of the enclosure 54a. At each design point, e.g., locations 68, 70, three conditions are satisfied according to the following equations:

$$B_{\rho=0}(z_i) = B_{\rho=0}(z_k)$$

$$|B_{\rho=0}'(z_i)| = G_z$$

$$B_{\rho=0}''(z_i) = 0$$

where,

B denotes the magnetic field,

B' denotes the first derivative of the magnetic field,

B" denotes the second derivative of the magnetic field, $z_i$ and $z_k$ refer to different volumetric slices, $\rho=0$ indicates that in this embodiment, the respective points in the slices are positioned on the longitudinal axis, and $G_z$ denotes a magnetic field gradient strength along the longitudinal axis (i.e., z-axis). Although the above equations assume the gradient field are generated along the z-axis, the same approach can be utilized for designing magnetic field gradients along the x- or y-axis.

With the first equation, the magnetic field values at each volumetric slice of interest, e.g., 66-1, 66-2, are equal; therefore, the spins at the center of each slice location exhibit substantially equal resonance frequencies. With the second equation, the local gradient strength is equal at each design point, e.g., location 68, to obtain a substantially constant slice thickness 72. The gradient strength at the neighboring slice location, 70, is set with alternating polarity. Otherwise, there will be at least one other location with the same magnetic field value as the actual desired slice location, which causes excitation of an additional undesired slice. Alternating polarity does not necessarily avoid undesired slice excitation between the desired slices. With the third equation, the second derivative of the magnetic field is zero at each design point, e.g., locations 68, 70, to extend the designed magnetic field distribution in the slice plane. Since the magnetic field distribution is angularly invariant and its Laplacian can be assumed to be zero, the second derivative with respect to radial dimension vanishes at the design points, e.g., at locations 68, 70, and ensures that a linear gradient exists within the desired volumetric slices, e.g., 66-1 and 66-2 in this example.

Accordingly, the first two sets of equations provide that the magnetic field values and the magnitude of first derivatives of the magnetic field 58 are substantially equal along at least one dimension at corresponding locations of the first and the second volumetric slices 66-1, 66-2 (e.g., at the center of all slices 66) to obtain frequency matching and same slice thickness 72. In order to extend the magnetic field distribution in the radial direction, the third set of equations forces second derivatives of the magnetic fields along said one dimension at said locations of the first and the second volumetric slices to be substantially zero. This sets other second derivatives to zero due to radial symmetry of the coil and zero Laplacian of the magnetic fields. Due to vanishing second derivatives, magnetic field distribution tends to be constant in slice.

Figure 4:
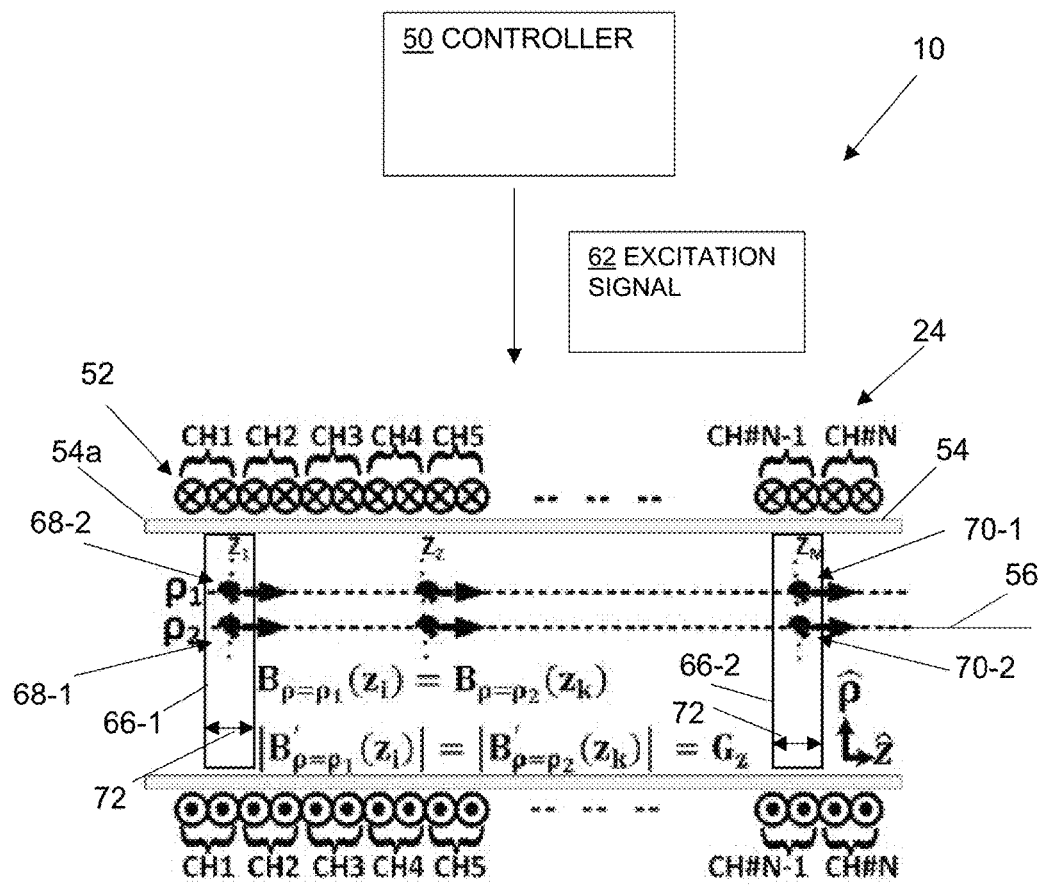
FIG. 4 illustrates a schematic representation of the controller of FIG. 2 applying an excitation signal to the gradient coil array, according to one arrangement.

Another approach to generate the spatially-varying magnetic field 58 with the aforementioned characteristics is termed the two point per slice technique (2PPS). For example, with reference to FIG. 4, M different volumetric slices, such as 66-1, 66-2, and N gradient channels 52 are shown and two off-centered locations or points, such as 68-1, 68-2 and 70-1, 70-2, are chosen in respective volumetric slices, such as 66-1, 66-2. For example, the locations 68-1, 68-2 and 70-1, 70-2 are positioned along respective axes that are orthogonal to the longitudinal 56 axis of the enclosure 54a. With the 2PPS technique, the controller 50 is configured to adjust weighting of applied currents to each gradient channel 52 to generate magnetic fields 58 that satisfy the following set of equations:

$$B_{\rho=\rho_1}(z_i) = B_{\rho=\rho_2}(z_k)$$

$$|B_{\rho=\rho_1}'(z_i)| = |B_{\rho=\rho_2}'(z_k)| = G_z$$

where,

B and B' denote, respectively, the magnetic field and the first derivative of the magnetic field, $z_i$ and $z_k$ denote difficult slices, ρ denotes a location (point) within a slice, and $G_z$ denotes a magnetic field gradient strength along the longitudinal axis (i.e., z-axis). Although the above equations assume the gradient field are generated along the z-axis, the same approach can be utilized for designing magnetic field gradients along the x- or y-axis.

The first equation provides that the magnetic field value is constant at all design points, e.g., 68-1, 68-2 and 70-1, 70-2, in all slice planes. The second set of equations has two different purposes. First, local magnetic field strengths at different slice positions, e.g., 68-1, 68-2 and 70-1, 70-2, are set to be equal in an alternating manner for constant slice thickness 72 for the same reason as that discussed above in the 1PPS method. Second, inside the same slice, local gradient strengths at two design points are equated with the same polarity so that a constant slice thickness region is extended on the slice plane. The first and second sets of equations contribute to the homogeneity of the magnetic field over the transverse plane. Since magnetic fields are designed at two design points, e.g., 68-1, 68-2 and 70-1, 70-2, in each slice, such as 66-1, 66-2, respectively, the slice profile deviation as a function of radius inside the slice can be lower than that in the 1PPS method.

The above 1PPS and 2PPS approaches require at least 3M−1 and 4M−1 array elements, respectively. If there are more array elements than the required number of array elements (3M−1 or 4M−1), the extra channels can be used for imposing additional constraints such as power dissipation, gradient maximization, better usage of physiological PNS limits, etc. For example, the extra channels can be used to maximize the gradient strength while also minimizing the gradient power. A general optimization can be defined as minimizing the L2 norm (i.e., the sum of squares) of the current vector (i.e., minimizing the sum of the square of currents flowing the coils). Such an optimization approach is defined in the following relations:

$$\min_x \|I\|,$$

$$C * I = 0,$$

$$f' \cdot I = G_z,$$

$$\|I\|_{infinity} < I_{max},$$

$$-V_{max} \leq \left[\frac{M}{risetime} + R\right] I \leq V_{max},$$

In the above equations, N is the number of channels, M is the targeted number of the volumetric slices that should be excited with a single-band RF pulse, I is an N×1 vector of current values of each channel. The optimization problem is defined for minimizing the L2 norm of the current. If the above 1PPS method is used, the C matrix is a 3M−2 matrix that includes the magnetic field constraints, including the magnitude of the magnetic fields and their first and second derivatives at the desired slice locations. If the above 2PPS method is used, C is a 4M−2×N matrix and contains related constrains regarding the magnetic field distributions in each channel. Further, in the above equations, f' is the gradient field strength produced by each channel at the slice locations, $G_z$ is the required gradient field strength, $I_{max}$ and $V_{max}$ denote the maximum hardware constraints for current and voltage. Defining the matrix C requires the knowledge of magnetic field distribution of each channel per unit current as well as desired slice locations. Therefore, the second constraint ensures that the required gradient strength is obtained, and the third and fourth constraints ensure that hardware limitations are not exceeded. The first constraint requires that the solution be in the null space of the matrix C. Dimension of the null space can be either N-3M+2 or N-4M+2, respectively, for the 1PPS and 2PPS methods. The solution vector I should be in the null space of C and its dot product with f' should have a constant magnitude and the aim of the optimization is to choose the smallest norm solution. Minimum norm solution is that vector I that is in the direction of f' as much as possible. Therefore, f' can be projected onto the null space of C, which ensures the minimum norm solution. If such a solution does not fit with third and fourth constraints, it is very likely that the required gradient strength cannot be obtained with the available hardware, so the algorithm can report the maximum available gradient strength under hardware limitations.

Returning to FIG. 2, following the generation of the magnetic field 58 by the gradient coil array 24, the RF coil 26 is configured to apply at least one RF pulse signal 80 to the volumetric slices 66 to excite a selected spin type of an object 14, thereby allowing the system 10 to generate a magnetic resonance image of the slices. The RF pulse 80 generated by the RF coil 26 can be configured in a variety of ways. For example, the RF pulse 80 can be configured as a single-band RF pulse having a bandwidth, e.g., in a range of between about 100 Hz and about 100 kHz. In another example, the RF pulse 80 can be configured as a multi-band RF pulse having a bandwidth, e.g., in a range of about 100 Hz and about 500 KHz. Further, the RF coil 26 can generate the RF pulse 80 over a variety of pulse durations. For example, the RF coil 26 can be configured to generate an RF pulse having a duration between about 400 microseconds and about 10 milliseconds.

By applying RF pulses 80 to multiple volumetric slices 66, the RF coil 26 generates relatively lower Specific Absorption Rate (SAR) energy which can be used for sequences demanding low SAR (such as patients with metallic implants) or it can be exchanged for lower duration RF pulse(s) (e.g., shorter echo time, signal increases). For example, with conventional gradients, in order to excite N slices, an N-band RF pulse has to be applied. By contrast the RF coil 26 can be configured to provide a single-band RF pulse 80 and, as such, the energy of the RF pulse 80 can be N times lower than a conventional pulse. The RF coil 26 can linearly decrease the energy of the pulse 80 by increasing the duration of the pulse 80. For example, because the RF coil 26 decreases the energy N times relative to conventional RF coils, the RF coil 26 can decrease the duration of the pulse N times for a constant energy with the clinical multi-band pulses (e.g., 400-500 μs RF pulses for multi-slice operation).

Further, by applying RF pulses 80 to multiple volumetric slices 66 in which a spatially-varying magnetic field 58 is established, the RF coil 26 can provide a performance improvement relative to application of RF pulses to conventional linear gradients. For example, relatively higher gradient strengths can be achieved, which can allow the RF coil 26 to generate relatively shorter duration RF pulses 80 with a relatively greater bandwidth. The relatively higher gradient strengths can be exchanged for relatively higher time-bandwidth product (i.e., the product of duration and the bandwidth) RF pulses to generate relatively sharper slice profiles. In another example, application of RF pulses 80 to multiple volumetric slices 66 can extend the usable volume of the gradient coil array 24 while exciting slices 66 relative to conventional single channel linear gradient coils, since conventional linear gradient coils typically have a volume of interest that is roughly half of its respective length. In another example, application of RF pulses 80 to multiple volumetric slices 66 can excite, invert, or refocus slices 66 at the edge of the gradient coil array 24 (e.g., for a total length of 27 cm). Further application of RF pulses 80 to multiple volumetric slices 66 in which a spatially-varying magnetic field 58 according to the present teachings is established can generate a relatively lower $B_{max}$, which can in turn provide a lower inductance and potentially lower peripheral nerve stimulation limits, and relatively lower power dissipation. The lower power dissipation can in turn provide lower cooling requirements, lower energy dissipation, and potentially lower acoustic noise and vibration.

The following Table provides various performance parameters which shows an increase in performance when applying RF pulses 80 to multiple volumetric slices 66 of a spatially-varying magnetic field 58.

As provided in the Table, the 1PPS method, 2PPS method and conventional linear gradient fields (LGF) are compared for different numbers of slices and different amounts of shift in terms of the RMSE error of the normalized slice thickness and $G_{lim}$, the gradient strength per unit norm current (g). Power dissipation ($P_{diss}$) and maximum amplitude of the magnetic field ($B_{max}$) are reported for 1 mT/m gradient strength.

TABLE

| | 1PPS Method | | | | | | 2PPS Method | | | | |
|---|---|---|---|---|---|---|---|---|---|---|---|
| | Shift = 0 cm | | | Shift = 3 cm | | | Shift = 0 cm | | Shift = 3 cm | | |
| | | | | Slice Number (N) | | | | | | | |
| | N = 1 | N = 2 | N = 3 | N = 1 | N = 2 | N = 3 | N = 1 | N = 2 | N = 1 | N = 2 | LGF |
| $G_{lim}$ (mT/m) | 125 | 39 | 19 | 121 | 39 | 20 | 100 | 30 | 95 | 29 | 24 |
| g (mT/m/A) | 2.8 | 1.3 | 0.5 | 2.7 | 1.3 | 0.6 | 2.3 | 1.2 | 2.2 | 1.2 | 0.8 |
| $P_{diss}$ (mW) | 172 | 729 | 5386 | 177 | 741 | 4174 | 251 | 861 | 263 | 893 | 2059 |
| $B_{max}$ (uT) | 80 | 98 | 107 | 89 | 106 | 137 | 98 | 239 | 114 | 265 | 167 |

When applying RF pulses 80 to multiple volumetric slices 66 of a spatially-varying magnetic field 58 a higher gradient strength can be achieved. For example, $G_{lim}$ is the maximum gradient that can be obtained with the system 10 and g is the gradient strength per unit current. Further, when applying RF pulses 80 to multiple volumetric slices 66 of a spatially-varying magnetic field 58 (g) a generally lower $B_{max}$ is achieved (i.e., in all cases except the 2PPS $2^{nd}$ slice). Further, the Table indicates that power dissipation is lower than conventionally observed.

As provided above, embodiments of the a multi-slice magnetic resonance imaging system includes an array of gradient coils 52 and a controller 50 configured to generate several different field combinations in the gradient coil array 24 by applying different weightings to the magnitude of a current applied to each gradient coil 52-1 through 52-N. In some embodiments, the multi-slice magnetic resonance imaging system 10 can provide multi-slice excitation of an object 14 being imaged with a single band RF pulse 80. As such, the system 10 can excite multiple slices at the same time for a given frequency, which can reduce the amount of time required to image an object relative to conventional imaging systems. Also, the system 10 can customize the magnetic field distribution for each patient, each disease, and each contrast mechanism separately. Further, based upon the above-described configuration, the system 10 is independent of the primary or $B_0$ magnetic field generated by the main magnet 22 and, as such, can be used inside conventional clinical MRI scanners, such as 1.5 T, 3 T, 7 T, and 10.5 T scanners, for example.

Figure 5:
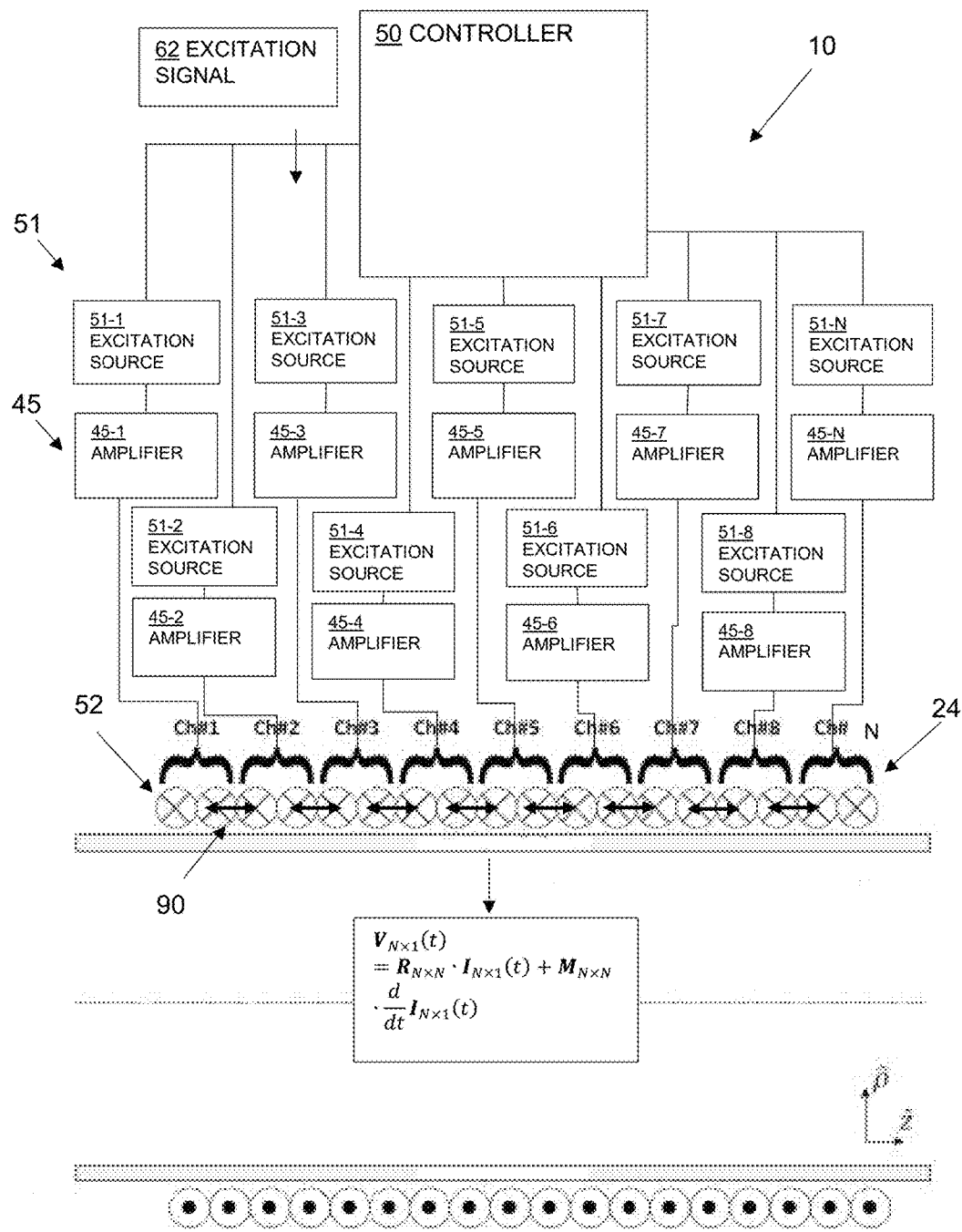
FIG. 5 illustrates a schematic representation of the controller and gradient coil array of FIG. 2 having an independent amplifier and excitation source for each gradient coil of the gradient coil array, according to one arrangement.

As provided above, the controller 50 is configured to utilize an excitation signal 62 to drive the gradient coil array 24. In one arrangement, the controller 50 can provide the excitation signal 62 to the gradient coil array 24 using a number of mechanisms. For example, with reference to FIG. 5, the multi-slice MRI system 10 can include one or more excitation sources 51 disposed in electrical communication with the controller 50 and with the gradient coils 52 of the gradient coil array 24. While the excitation sources 51 can be configured in a variety of ways, in one arrangement, the excitation sources 51 are configured as voltage sources, current sources, or as a combination of voltage and current sources.

During operation, the controller 50 is configured to transmit the excitation signal 62 to the excitation sources 51. For example, the excitation signal 62 can direct the excitation sources 51 to apply particular voltages or currents to the gradient coils 52 to induce different currents therein. Induction of the currents within the gradient coils 52 causes the gradient coils 52 to generate the spatially-varying magnetic field 58.

Figure 7:
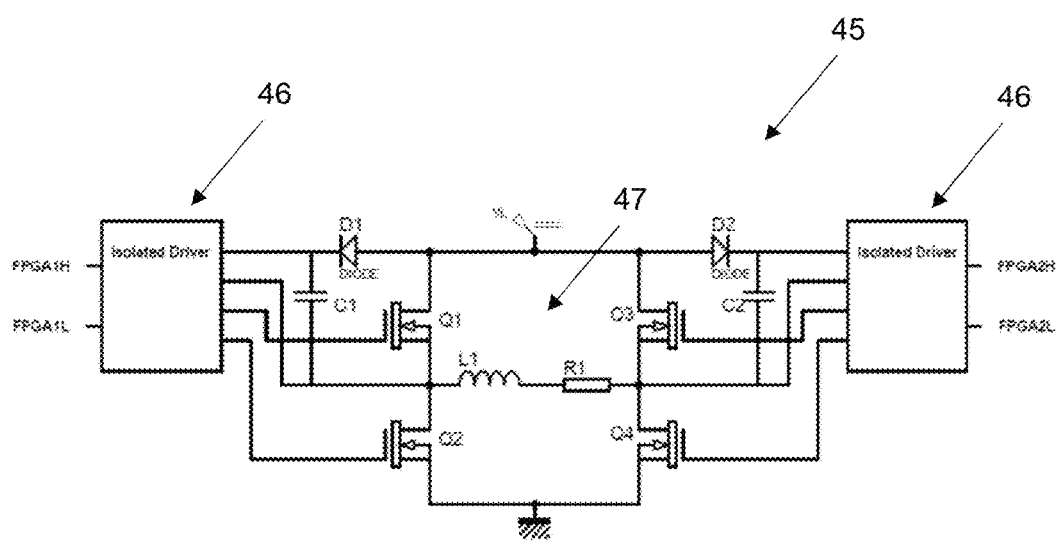
FIG. 7 illustrates an example schematic representation of an H-bridge amplifier as utilized with the multi-slice magnetic resonance imaging system of FIG. 1, according to one arrangement.

In one arrangement, the multi-slice MRI system 10 can include one or more amplifiers 45 disposed in electrical communication with respective excitation sources 51 and with respective gradient coils 52 of the gradient coil array 24. While each amplifier can be configured in a variety of ways, in one arrangement, each amplifier 45 is configured as an H-bridge amplifier, an example schematic of which is illustrated in FIG. 7. The H-bridge amplifier 45 illustrated includes isolated MOSFET drivers 46 and a load 47 that is modeled as an inductor in series with a resistor. Each amplifier 45 is configured as a switching amplifier based on pulse width modulated signals. For example, each amplifier is driven with a square wave-type input signal. The output signal of each amplifier 45 is encoded in the pulse widths at each amplifier's input and provided to the corresponding gradient coil 52 to induce a current therein. In one arrangement, because the multi-slice MRI system 10 can include one amplifier per gradient coil 52, each amplifier 45 can be configured to generate a relatively lower power compared to amplifiers utilized in conventional MRI systems where the voltage and current rating for each amplifier 45 is dependent upon the radius of the gradient coil array 24.

With continued reference to FIG. 6, in one arrangement, the gradient coils 52 of the gradient coil array 24 can be mutually inductively coupled 90 to each other, such as by a coupling matrix M. This matrix M can influence the voltage needed to induce different current in each gradient coil 52 according to the relationship:

$$V_{N\times 1}(t) = R_{N\times N} \cdot I_{N\times 1}(t) + M_{N\times N} \cdot \frac{d}{dt} I_{N\times 1}(t)$$

where, $V_{N\times 1}(t)$ denotes the voltage waveforms applied to N coils,
$I_{N\times 1}(t)$ denotes the currents induced in the coils,
$M_{N\times N}$ is a matrix indicative of inductive coupling coefficients between the coils, and
$R_{N\times N}$ is a matrix indicative of Ohmic resistances of the coils.

In one arrangement, the controller 50 is configured to account for the coupling matrix M when providing the excitation signal 62 to the gradient coils 52. For example, during operation, the controller 50 is configured to provide an excitation signal 62 to excitation sources 51 and amplifiers 45 so that the voltages applied to the gradient coils 52 for generating desired currents in the gradient coils 52 account for the coupling matrix M, as provided by the above relationship. With application of the above-referenced relationship to the excitation signal 62, pre-distortion or pre-emphasis similar to conventional linear gradients can occur, but under the presence of mutual coupling between array coils. Accordingly, a desired time dependency of the current for each gradient coil 52 can be obtained, despite the mutual coupling between gradient coils 52.

As described above, the gradient coils 52 are configured to generate spatially-varying magnetic fields 58 within the enclosure 54a where the spatially-varying magnetic field 58 can exhibit a spatial variation, such as a sine wave, triangle wave, or square pulse wave. Such description is by way of example only. In one arrangement, the continuous winding of the gradient coils 52 can also be configured to generate conventional linear gradient fields. For example, current weightings for each gradient coil 52 of the array 24 can be solved for certain parameters such as linearity error, power dissipation, maximum B field, and maximum gradient strength. Such conventional linear gradient fields can be used for encoding purposes during an MRI procedure, such as phase encoding, frequency encoding, diffusion encoding, and motion encoding for example. Further, these conventional linear gradient fields can be optimized for different volumes of interest (VOI), different linearity error criteria, and/or power dissipation in a case by case manner.

Figure 8:
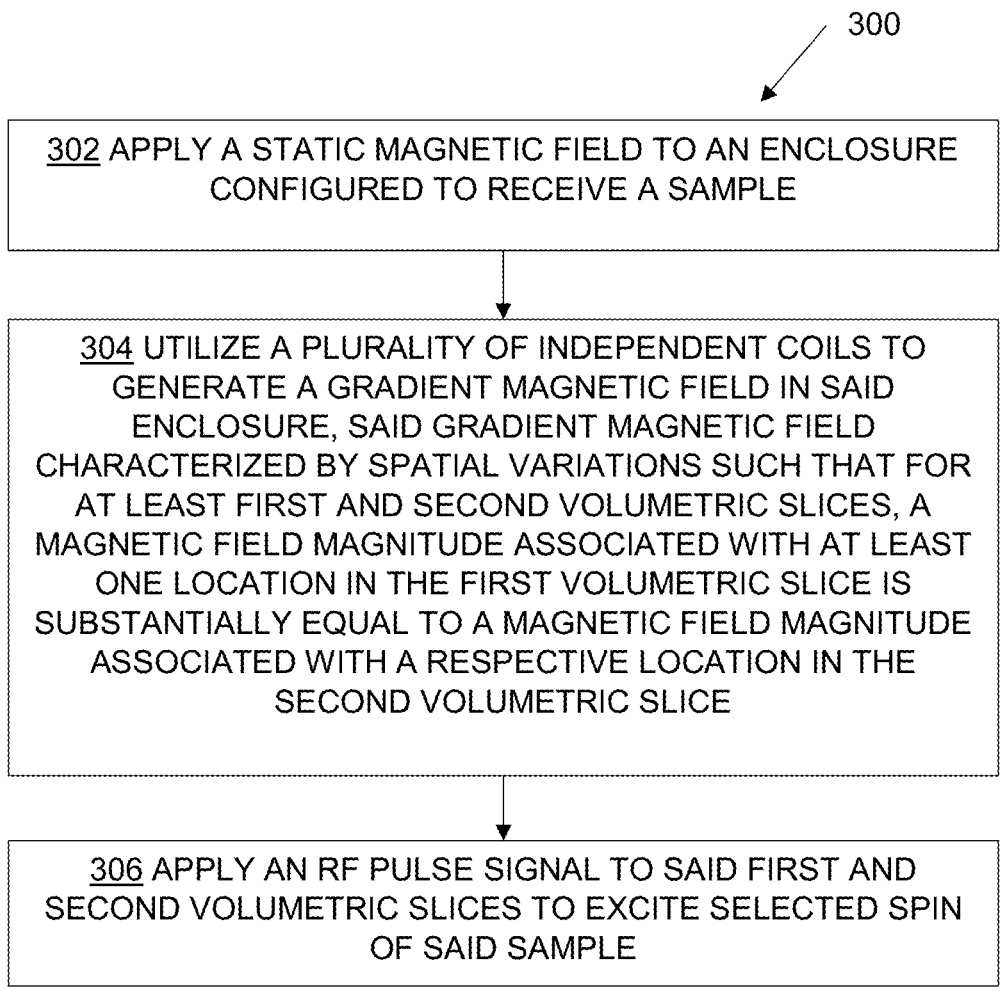
FIG. 8 is a flowchart of a method performed by the multi-slice magnetic resonance imaging system, according to one arrangement.

In use, the multi-slice MRI system 10 is configured to generate a magnetic resonance image. FIG. 8 is a flowchart 300 of an example method performed by the multi-slice MRI system 10 when generating the image.

In step 302, the MRI system 10 applies a static magnetic field to an enclosure configured to receive a sample. For example, with reference to FIG. 1, the main magnet 22 of the magnetic field generator 12 is configured to generate a primary or $B_0$ magnetic field, which is a static magnetic field, to align the magnetic dipole moments of the nuclei included in the object 14 in a predetermined direction.

Returning to FIG. 8, in step 304, the MRI system 10 utilizes a plurality of independent coils 52 to generate a gradient magnetic field 58 in said enclosure, said gradient magnetic field characterized by spatial variations such that for at least first and second volumetric slices 66-1, 66-2, a magnetic field magnitude associated with at least one location in the first volumetric slice is substantially equal to a magnetic field magnitude associated with a respective location in the second volumetric slice. For example, with reference to FIG. 2, the controller 50 selects an excitation signal 62 and provides the excitation signal 62 to the gradient coil array 24 to generate the magnetic field wave 58 where the magnetic field 58 has a spatial variation across multiple volumetric slices 66 such that the magnitudes of the magnetic field at respective locations of two or more volumetric slices are substantially equal.

Returning to FIG. 8, in step 306, the MRI system 10 applies an RF pulse signal 80 to said first and second volumetric slices 66-1, 662 to excite selected spin type of said sample. A signal generated by the excited spins can then be collected and analyzed, for example, by using methods known in the art.

It is noted that while application of RF pulses 80 to multiple volumetric slices 66 can be utilized for excitation, the MRI system 10 can also utilize the RF pulses 80 for other applications, such as inversion and refocusing for example, as well.

While various embodiments of the innovation have been particularly shown and described, it will be understood by those skilled in the art that various changes in form and details may be made therein without departing from the spirit and scope of the innovation as defined by the appended claims.

What is claimed is:

1. A system for multi-slice magnetic resonance imaging (MRI), comprising:
   a gradient coil array comprising a plurality of independent coils distributed about an enclosure; and
   a controller configured to concurrently actuate said plurality of coils so as to generate a spatially-varying magnetic field within said enclosure such that for at least first and second volumetric slices, a magnetic field magnitude associated with at least one location in the first volumetric slice is substantially equal to a magnetic field magnitude associated with a respective location in the second volumetric slice.

2. The system of claim 1, wherein the controller is configured to select a plurality of excitation signals applied to said plurality of coils such that magnitudes of first derivatives of the magnetic field along at least one dimension at said locations of the first and the second volumetric slices are substantially equal.

3. The system of claim 2, wherein said controller is configured to select said plurality of excitation signals applied to said plurality of coils such that the second derivatives of the magnetic fields along said one dimension at said locations of the first and the second volumetric slices are substantially zero.

4. The system of claim 1, further comprising at least one excitation source operating under control of said controller and in electrical communication with said coils for inducing a current therein.

5. The system of claim 4, wherein said excitation source comprises any of a voltage source and a current source.

6. The system of claim 4, wherein said controller is configured to transmit at least one signal to said at least one excitation source to induce different currents in said coils so as to generate said spatially-varying magnetic field.

7. The system of claim 6, wherein said spatially-varying magnetic field satisfies the following relations at said location of said first and second slices:

$$B_{\rho=0}(z_i)=B_{\rho=0}(z_k)$$

$$|B_{\rho=0}'(z_i)|=G_z$$

$$B_{\rho=0}''(z_i)=0$$

wherein B relates to a magnetic field, z relates to a position of the magnetic field gradient along a longitudinal axis of said enclosure, p relates to a position of the magnetic field gradient along a vertical axis of said enclosure, and $G_z$ relates to a magnetic field gradient strength along the z axis.

8. The system of claim 1, wherein said at least one location in each of said first and second slices comprises two locations.

9. The system of claim 8, wherein said spatially-varying magnetic field satisfies the following relations:

$$B_{\rho=\rho_1}(z_i)=B_{\rho=\rho_2}(z_k)$$

$$|B_{\rho=\rho_1}'(z_i)|=|B_{\rho=\rho_2}'(z_k)|=G_z$$

wherein B relates to a magnetic field, z relates to a position of the magnetic field gradient along a longitudinal axis of said enclosure, ρ relates to a position of the magnetic field gradient along a vertical axis of said enclosure, and $G_z$ relates to a magnetic field gradient strength along the z axis.

10. The system of claim 1, wherein said at least one location in each slice is positioned on a longitudinal axis of said enclosure.

11. The system of claim 1, wherein said at least one location in each slice is positioned on an axis orthogonal to said longitudinal axis of the enclosure.

12. The system of claim 1, wherein said spatially-varying magnetic field exhibits a spatially periodic variation.

13. The system of claim 8, wherein a first of said two locations is positioned on the longitudinal axis of the enclosure and the other location is offset relative to the first location along an axis orthogonal to said longitudinal axis.

14. The system of claim 1, wherein said slices have a width along at least dimension in a range of about 0.5 mm to about 10 mm.

15. The system of claim 1, further comprising a set of cables disposed in electrical communication between the controller and the gradient coil array.

16. The system of claim 4, wherein said at least one excitation source comprises a plurality of excitation sources each in electrical communication with one of said coils.

17. The system of claim 16, further comprising a plurality of amplifiers each of which is electrical communication with one of said excitation sources and one of said coils for amplifying excitation signals applied to said coils.

18. The system of claim 1, further comprising at least one radiofrequency (RF) coil configured to apply at least one RF pulse to said volumetric slices.

19. The system of claim 17, further comprising a shield disposed in said enclosure to decouple an RF field generated by said at least one RF coil from the magnetic field generated by said coil array.

20. The system of claim 1, wherein said slices have a width along at least one dimension in a range of about 2 mm to about 20 cm.

21. The system of claim 18, wherein said at least one RF pulse is a single-band RF pulse.

22. The system of claim 18, wherein said at least one RF pulse is a multi-band RF pulse.

23. The system of claim 22, wherein said multi-band RF pulse has a bandwidth in a range of about 100 Hz to about 500 KHz.

24. The system of claim 21, wherein said single-band RF pulse has a bandwidth in a range of about 100 Hz to about 100 kHz.

25. The system of claim 18, wherein said RF pulse has a duration in a range 400 microseconds to 10 milliseconds.

26. The system of claim 6, wherein said controller is configured to select a plurality of excitation signals applied to said coils such that a magnetic field gradient associated with each coil has a gradient strength greater than about 80 mT/m/Amp.

27. The system of claim 1, further comprising a shell providing said enclosure, wherein said coils are coupled to said shell.

28. The system of claim 17, wherein said gradient coils are inductively coupled to one another.

29. The system of claim 28, wherein said controller is configured to apply at least one signal to said amplifiers so that voltages applied to the coils for generating desired currents in the said coils are according to the following relation:

$$V_{N \times 1}(t) = R_{N \times N} \cdot I_{N \times 1}(t) + M_{N \times N} \cdot \frac{d}{dt} I_{N \times 1}(t)$$

wherein V relates to voltage, R relates to resistance, I relates to current, and M relates to an inductive coupling matrix to the gradient coils.

30. A magnetic resonance imaging system, comprising:
a magnetic field generator having a gradient coil array, each coil of the array being configured to generate a magnetic field independent of a magnetic field generated by any of the other coils of the array;
a set of amplifiers, each of which being in electrical communication with one of said coils of the array for applying an excitation signal to said coil; and
a controller in electrical communication with said amplifiers and configured to apply a plurality of signals to said amplifiers such that the amplifiers apply a plurality of excitation signals to said coils for generating a magnetic field such at least first and second volumetric slices associated with at least two of said coils exhibit a magnetic field distribution characterized by substantially similar magnetic field gradients.

31. A method for generating a magnetic resonance image, comprising
applying a static magnetic field to an enclosure configured to receive a sample;
utilizing a plurality of independent coils to generate a gradient magnetic field in said enclosure, said gradient magnetic field characterized by spatial variations such that for at least first and second volumetric slices, a magnetic field magnitude associated with at least one location in the first volumetric slice is substantially equal to a magnetic field magnitude associated with a respective location in the second volumetric slice; and
applying an RF pulse signal to said first and second volumetric slices to excite a selected spin of said sample.

32. The method of claim 31, comprising providing an excitation signal to the plurality of independent coils to generate the magnetic field where the magnetic field magnitude associated with the at least one location in the first volumetric slice is substantially equal to the magnetic field magnitude associated with the respective location in the second volumetric slice.

33. The method of claim 31, wherein said gradient magnetic field characterized by spatial variations satisfies the following relations at said location of said first and second slices:

$B_{\rho=0}(z_i) = B_{\rho=0}(z_k)$ $|B_{\rho=0}'(z_i)| = G_z$ $B_{\rho=0}''(z_i) = 0$ wherein B relates to a magnetic field, z relates to a position of the magnetic field gradient along a longitudinal axis of said enclosure, ρ relates to a position of the magnetic field gradient along a vertical axis of said enclosure, and $G_z$ relates to a magnetic field gradient strength along the z axis.

34. The method of claim 31, wherein said gradient magnetic field characterized by spatial variations satisfies the following relations:

$B_{\rho=\rho_1}(z_i) = B_{\rho=\rho_2}(z_k)$ $|B_{\rho=\rho_1}'(z_i)| = |B_{\rho=\rho_2}'(z_k)| = G_z$ wherein B relates to a magnetic field, z relates to a position of the magnetic field gradient along a longitudinal axis of said enclosure, ρ relates to a position of the magnetic field gradient along a vertical axis of said enclosure, and $G_z$ relates to a magnetic field gradient strength along the z axis.

\* \* \* \* \*